United States Patent
Lee et al.

(10) Patent No.: US 6,969,189 B2
(45) Date of Patent: Nov. 29, 2005

(54) LED BACKLIGHT MODULE

(75) Inventors: Liu-Chung Lee, Pingtung (TW); Chih-Wei Lin, Taichung (TW)

(73) Assignee: Au Optronics Corp., Hsinchu (TW)

( * ) Notice: Subject to any disclaimer, the term of this patent is extended or adjusted under 35 U.S.C. 154(b) by 118 days.

(21) Appl. No.: 10/629,731

(22) Filed: Jul. 30, 2003

(65) Prior Publication Data

US 2004/0228107 A1 Nov. 18, 2004

(30) Foreign Application Priority Data

May 12, 2003 (TW) .......................... 92112782 A

(51) Int. Cl.⁷ ................................. F21V 7/04
(52) U.S. Cl. .................. 362/631; 362/613; 362/612; 362/627; 362/24; 362/27; 362/561
(58) Field of Search ................. 362/31, 24, 27, 362/561; 385/146; 349/65

(56) References Cited

U.S. PATENT DOCUMENTS 5,921,652 A * 7/1999 Parker et al. .................. 362/31
5,975,711 A * 11/1999 Parker et al. .................. 362/24

FOREIGN PATENT DOCUMENTS

EP 1 030 208 A2 8/2000

* cited by examiner

Primary Examiner—Thomas M. Sember
Assistant Examiner—James W Cranson, Jr.
(74) Attorney, Agent, or Firm—Rabin & Berdo, PC

(57) ABSTRACT

An LED backlight module. The LED backlight module comprises a printed circuit board, a plurality of LEDs, and a light transmissive material. The LEDs are disposed on the printed circuit board. The light transmissive material is coated on the printed circuit board. Particularly, the LEDs are embedded in the light transmissive material and arranged in a matrix.

9 Claims, 2 Drawing Sheets

LED BACKLIGHT MODULE

BACKGROUND OF THE INVENTION

1. Field of the Invention

The present invention relates to a Light-Emitting Diode (LED) backlight module, and in particular to an LED backlight module that provides uniform illumination by embedding a plurality of LEDs in the light transmissive material and arranging them in a matrix.

2. Description of the Related Art

With the progress of semiconductor and flat panel display manufacturing technology, traditional Cathode Ray Tube (CRT) displays have increasingly been replaced by flat panel displays having small size and low radiation such as Liquid Crystal Displays (LCDs).

In general, the conventional backlight module of an LCD uses the Cold Cathode Fluorescent Lamp (CCFL) as the light source. However, the Cold Cathode Fluorescent Lamp does not easily ignite in a low temperature environment, and an auxiliary heater is typically provided particularly in cold areas. Moreover, Cold Cathode Fluorescent Lamp requires adequate idle time in order to start and operate normally. As a result of the above-mentioned disadvantages, LEDs have been increasingly applied instead of the conventional CCFL as the light source of a backlight module.

Referring to FIG. 1, a conventional LED backlight module has a reflector 11, a guiding plate 12, a first diffusion layer 13, a first lens layer 14, a second lens layer 15, and a second diffusion layer 16. Two LEDs 17 are disposed on both side of the guiding plate 12 as the light sources. The light emitted from the LEDs 17 enters the guiding plate 12 then reflects via the reflector 11. Subsequently, the reflecting light progresses upward and exits through the second diffusion layer 16. However, as the LEDs 17 are disposed on the sides of the guiding plate 12, the conventional backlight module 1 does not provide uniform illumination due to the poor light incident posture of the LEDs 17. Moreover, as the LEDs 17 are not integrated with the conventional backlight module 1, light dissipation and loss occur due to the gaps between the LEDs 17 and the guiding plate 12.

To overcome disadvantages mentioned above, the present invention provides a LED backlight module capable of delivering uniform illumination without light dissipation and loss.

SUMMARY OF THE INVENTION

An object of the invention is to provide an LED lighting module capable of delivering uniform illumination without light dissipation and loss by embedding a plurality of LEDs in the light transmissive material and arranging them in a matrix.

The LED backlight module comprises a printed circuit board, a plurality of LEDs, and a light transmissive material. The LEDs are disposed on the printed circuit board. The light transmissive material is coated on the printed circuit board. Particularly, the LEDs are embedded in the light transmissive material and arranged in a matrix.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
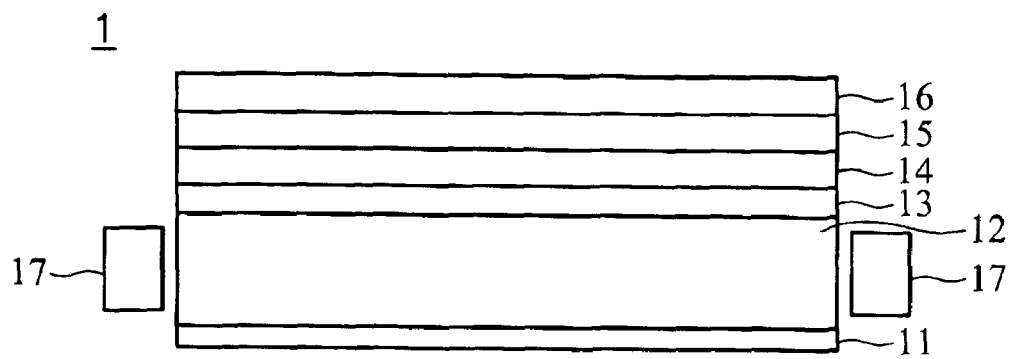
FIG. 1 is a sectional view of a conventional backlight module.
Figure 2:
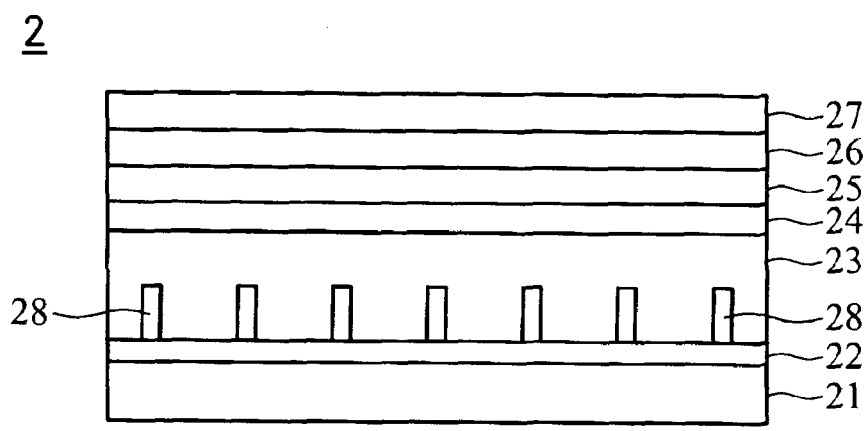
FIG. 2 is a sectional view of the backlight module in accordance with the present invention.

FIG. 2 is a sectional view of the backlight module in accordance with the present invention. As shown in FIG. 2, a printed circuit board 21 is disposed at the bottom of the LED backlight module 2. The printed circuit board 21 has a reflective material 22 coated on the top surface to reflect light such as the function of conventional reflector 11 mentioned in FIG. 1. Moreover, a plurality of LEDs 28, are electrically mounted on the printed circuit board 21 to provide illumination. The number of the LEDs 28 can be predetermined to meet the required illumination. Thus, the required illumination can be fulfilled by the printed circuit board 21 layout providing appropriate electric voltage and current to drive the LEDs 28. Particularly, the LEDs 28 are electrically mounted on the printed circuit board 21 by Surface Mount Technology (SMT).

Furthermore, a light transmissive material 23 is coated on the printed circuit board 21, wherein the light transmissive material 23 can be Polymethylmethacrylate (PMMA) or Polycarbonate (PC). To improve the uniformity of illumination without light dissipation and loss, a first diffusion layer 24, a first lens layer 25, a second lens layer 26 and a second diffusion layer 27 are disposed on the light transmissive material 23 sequentially. The diffusion layers 24 and 27 can diffuse light and the lens layers 25 and 26 prevent light loss and dissipation due to scattering and diffusion such that the light intensity of the LED backlight module 2 increases.

Figure 3:
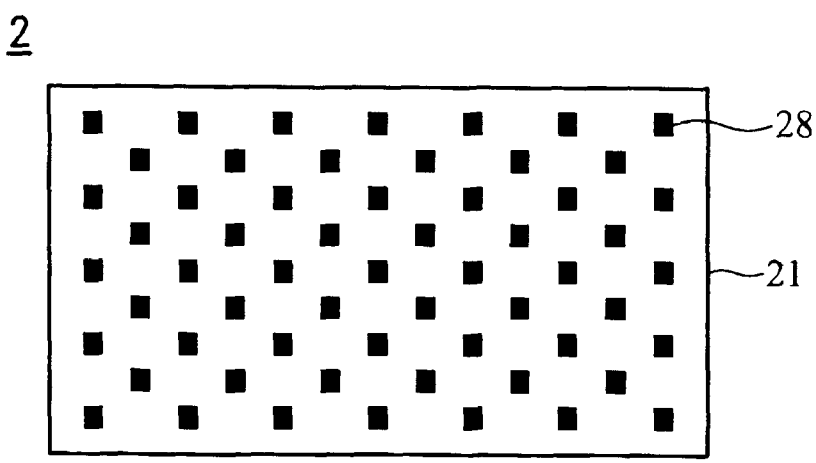
FIG. 3 is a top view of the backlight module in accordance with the present invention.

FIG. 3 is a top view of the backlight module in accordance with the present invention. Referring to FIG. 3, in particular, the LEDs 28 are disposed on the printed circuit board 21 and evenly arranged in a matrix. Opposite to the conventional backlight module 1 with LEDs disposed on the sides, the present invention provides evenly distributed light sources without limitation to the arrangement thereof due to the size and shape of the backlight module.

Figure 4:
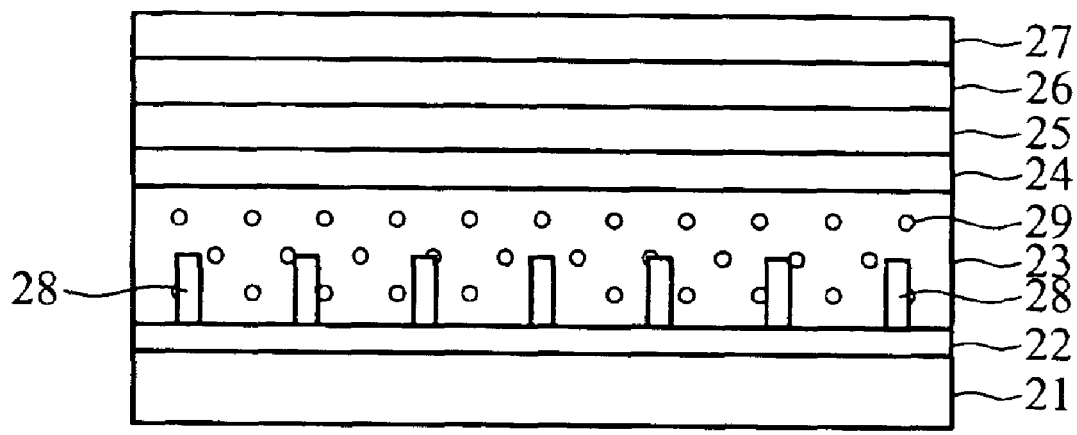
FIG. 4 is a sectional view of the backlight module with spacers implanted in the light transmissive material according to the present invention.

FIG. 4 is a sectional view of the backlight module with spacers implanted in the light transmissive material in accordance with the present invention. As shown in FIG. 4, the light transmissive material 23 is coated on the printed circuit board 21. In order to increase the uniformity of illumination, a plurality of spacers 29 are implanted in the light transmissive material 23 to enhance light diffusion.

Figure 5:
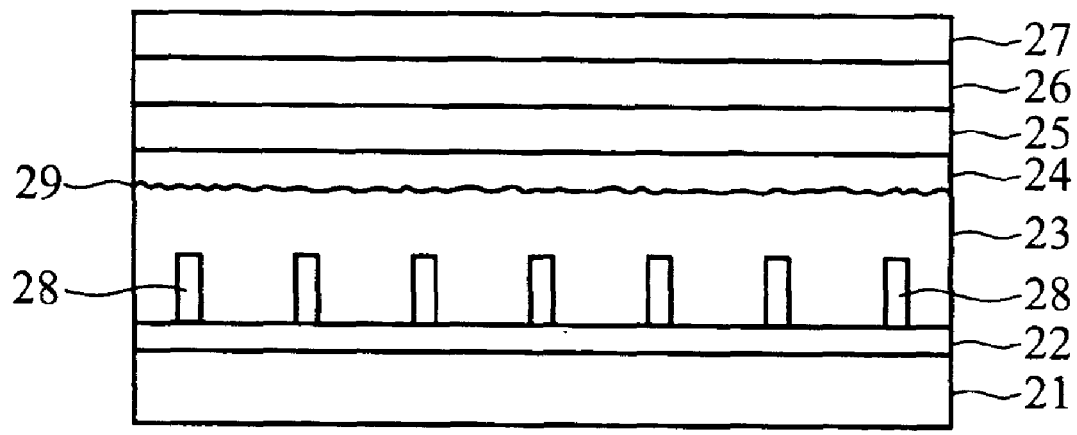
FIG. 5 is a sectional view of the backlight module with spacers implanted on the light transmissive material surface in accordance with the present invention.

However, the spacers 29 can also be implanted on the surface of the light transmissive material 23 to diffuse light. Referring to FIG. 5, a plurality of spacers 29 are spread on the light transmissive material 23. In FIG. 5, the spread spacers 29 cause an uneven interface between the light transmissive material 23 and the first diffusion layer 24. Thus, the light emitted from the LEDs 28 embedded in the light transmissive material 23 can be thoroughly diffused due to the spacers 29 at the interface between the light transmissive material 23 and the first diffusion layer 24 such that the LED backlight module 2 is capable of delivering uniform illumination in accordance with the present invention.

In summary, the LEDs 28 in the present invention are embedded in the light transmissive material 23 with a better emitting posture. Moreover, the LEDs 28 are integrated within the LED backlight module 2 capable of preventing light dissipation and loss due to the gaps between the LEDs 17 and the guiding plate 12 with respect to the conventional LED backlight module 1 mentioned above. Furthermore, the LEDs 28 are directly mounted on the printed circuit board 21 by Surface Mount Technology (SMT) to simplify the assembling processes and greatly improve the manufacturing efficiency. Additionally, as the LEDs 28 are arranged on the printed circuit board 21 in a matrix, the LED backlight module 2 can provide more uniform illumination without light dissipation and loss with this arrangement according to the present invention.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An LED backlight module, comprising:

a printed circuit board;

a plurality of LEDs disposed on the printed circuit board, and being arranged on the printed circuit board in a matrix; and a light transmissive material coating on the printed circuit board, wherein the LEDs are embedded in the light transmissive material.

2. The LED backlight module as claimed in claim 1, wherein the LEDs are disposed on the printed circuit board by means of Surface Mount Technology (SMT).

3. The LED backlight module as claimed in claim 1, wherein the printed circuit board has a reflective material disposed thereon to reflect light.

4. The LED backlight module as claimed in claim 1, further comprising a plurality of spacers implanted on the surface of the light transmissive material.

5. The LED backlight module as claimed in claim 1, wherein the LEDs are connected directly to the printed circuit board.

6. The LED backlight module as claimed in claim 1, further comprising a plurality of spacers implanted in the light transmissive material.

7. An LED backlight module, comprising:

a printed circuit board;

a plurality of LEDs disposed on the printed circuit board;

a light transmissive material coating on the printed circuit board, wherein the LEDs are embedded in the light transmissive material; and a plurality of spacers implanted in the light transmissive material.

8. The LED backlight module as claimed in claim 7, wherein the LEDs are arranged on the printed circuit board in a matrix.

9. The LED backlight module as claimed in claim 7, wherein the LEDs are connected directly to the printed circuit board.

* * * * *